United States Patent [19]

Merryman et al.

[11] Patent Number: 5,322,999
[45] Date of Patent: Jun. 21, 1994

[54] METHOD AND APPARATUS FOR PRECISION CONTROL OF GALVANOMETER PATTERNING SYSTEM

[76] Inventors: Jerry D. Merryman, 3315 Darbyshire Dr., Dallas, Tex. 75229; S. Charles Baber, 1211 Annapolis Dr., Richardson, Tex. 75081

[21] Appl. No.: 960,987
[22] Filed: Oct. 13, 1992
[51] Int. Cl.$^5$ .............................. G01D 5/30
[52] U.S. Cl. .................. 250/230; 250/231.16
[58] Field of Search ............ 250/230, 236, 231.16, 250/237 G, 225, 235

[56] References Cited

U.S. PATENT DOCUMENTS 4,490,608 12/1984 Yeadon et al. .................. 250/235
4,835,704 5/1989 Eichelberger et al. ............ 364/490

Primary Examiner—Davis L. Willis
Assistant Examiner—T. Davenport

[57] ABSTRACT

A method and apparatus for precise control of a galvanometer patterning system is provided in which a patterning beam (12) is deflected off of a galvanometer mirror (14) toward a work piece (10). The position of the galvanometer mirror (14) is determined by generating a measurement beam (20), transmitting it through a cylinder lens (26) and deflecting it off of the galvanometer mirror (14). The deflected measurement beam (20) is filtered through grating filter (28) having two side-by-side gratings. Light passing through the side-by-side gratings filter (28) is focused on a detector (36) through an anamorphic condenser (32 and 34).

15 Claims, 4 Drawing Sheets

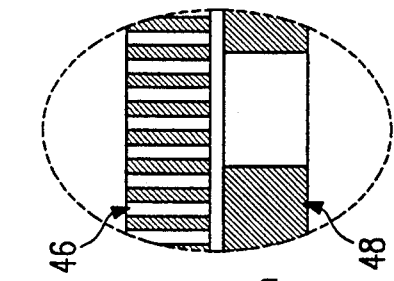
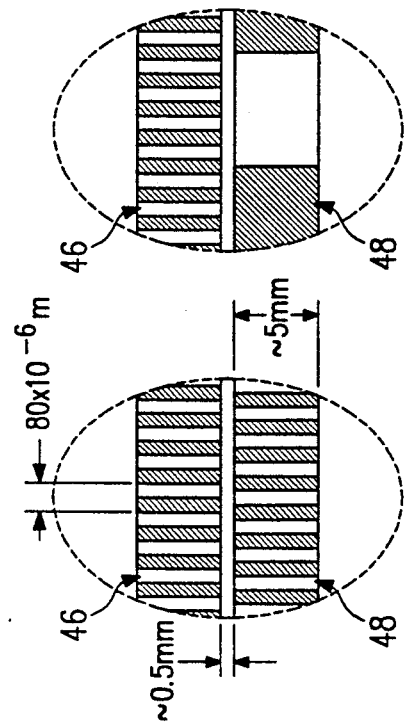
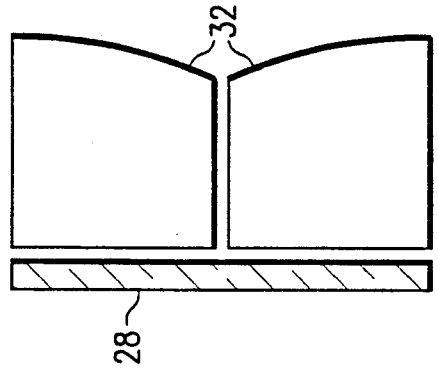
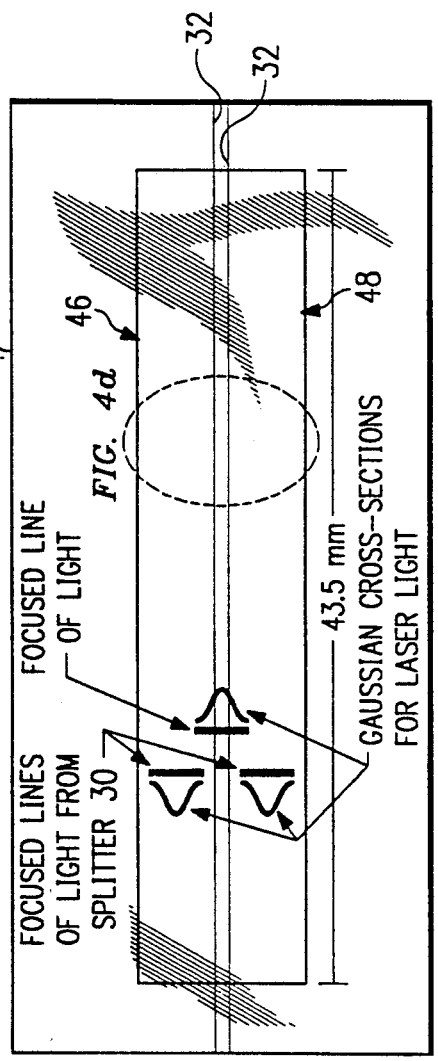
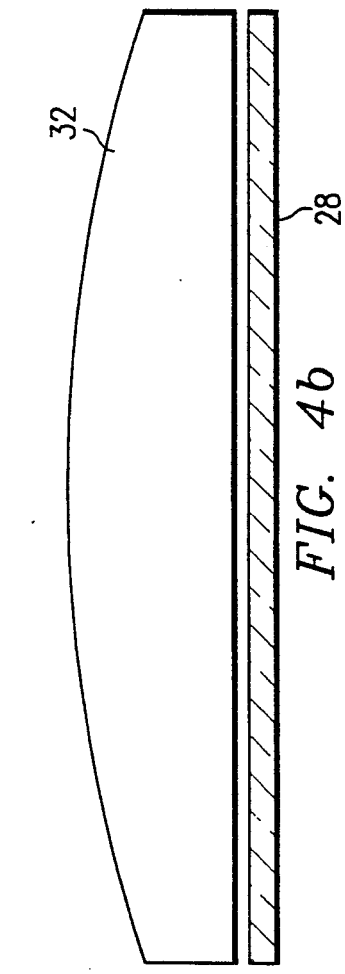

METHOD AND APPARATUS FOR PRECISION CONTROL OF GALVANOMETER PATTERNING SYSTEM

TECHNICAL FIELD OF THE INVENTION

This invention relates generally to galvanometer patterning systems, and more particularly to a method and apparatus for precision control of galvanometer patterning systems.

BACKGROUND OF THE INVENTION

Galvanometer patterning systems are widely used for processing of a myriad of workpieces. For example, patterns may be etched in plastic workpieces by deflecting a patterning beam off of a computer controlled galvanometer mirror.

In high speed precision applications of galvanometers for optical deflection, inertia associated with the galvanometer mirror and the drive shaft, and other losses, prevent the galvanometer from precisely following the command current input. Consequently, a persistent problem in galvanometer patterning systems is a lack of precise patterning due to the imprecise positioning of the galvanometer mirror.

Therefore, a need has arisen for a system and method of obtaining real time measurement of the position of the galvanometer mirror for precision control of galvanometer patterning systems.

SUMMARY OF THE INVENTION

In accordance with the present invention, a method and apparatus for-precision control of patterning systems is provided which substantially eliminates or reduces disadvantages and problems associated with prior art systems. In particular, a galvanometer, including a galvanometer mirror, is provided. A light source generates measurement beam which is focused into a focused line by a cylinder lens and deflected off of the galvanometer mirror. This focused line falls on a grating filter having two sets of gratings, each set of gratings being offset. Movement of the galvanometer mirror causes the focused line to move along the gratings thereby blocking or passing the focused line based on the position of the galvanometer. A detector detects light from the focused line transmitted through each set of gratings.

In a particular embodiment, a splitter is included to generate, in cooperation with the cylinder lens, two focused lines, such that the focused line is divided into two focused lines, each of the focused lines falling on a different set of gratings. In particular embodiments, the splitter may be a binary defractive phase-grating or a bi-prism.

An important technical advantage of the present invention inheres in the fact that precise measurement of a galvanometer patterning system is achieved by focusing a focused line on a grating filter having two sets of gratings. Another important technical advantage of the present invention is the fact that a splitter may be included such that the focused line is divided into two focused lines, each of the focused lines falling on a different set of gratings.

BRIEF DESCRIPTION OF THE DRAWINGS

For a more complete understanding of the present invention and the advantages thereof, references is now made to the following description taken in conjunction with the accompanying drawings in which like reference numbers indicate like features and wherein:

FIGS. 4a through 4e illustrate gratings and lens segments according to the present invention;

DETAILED DESCRIPTION OF THE INVENTION

The preferred embodiments of the present invention are illustrated in FIGS. 1 through 7 of the drawings, like numerals being used to refer to like and corresponding parts of the various drawings.

Figure 1:
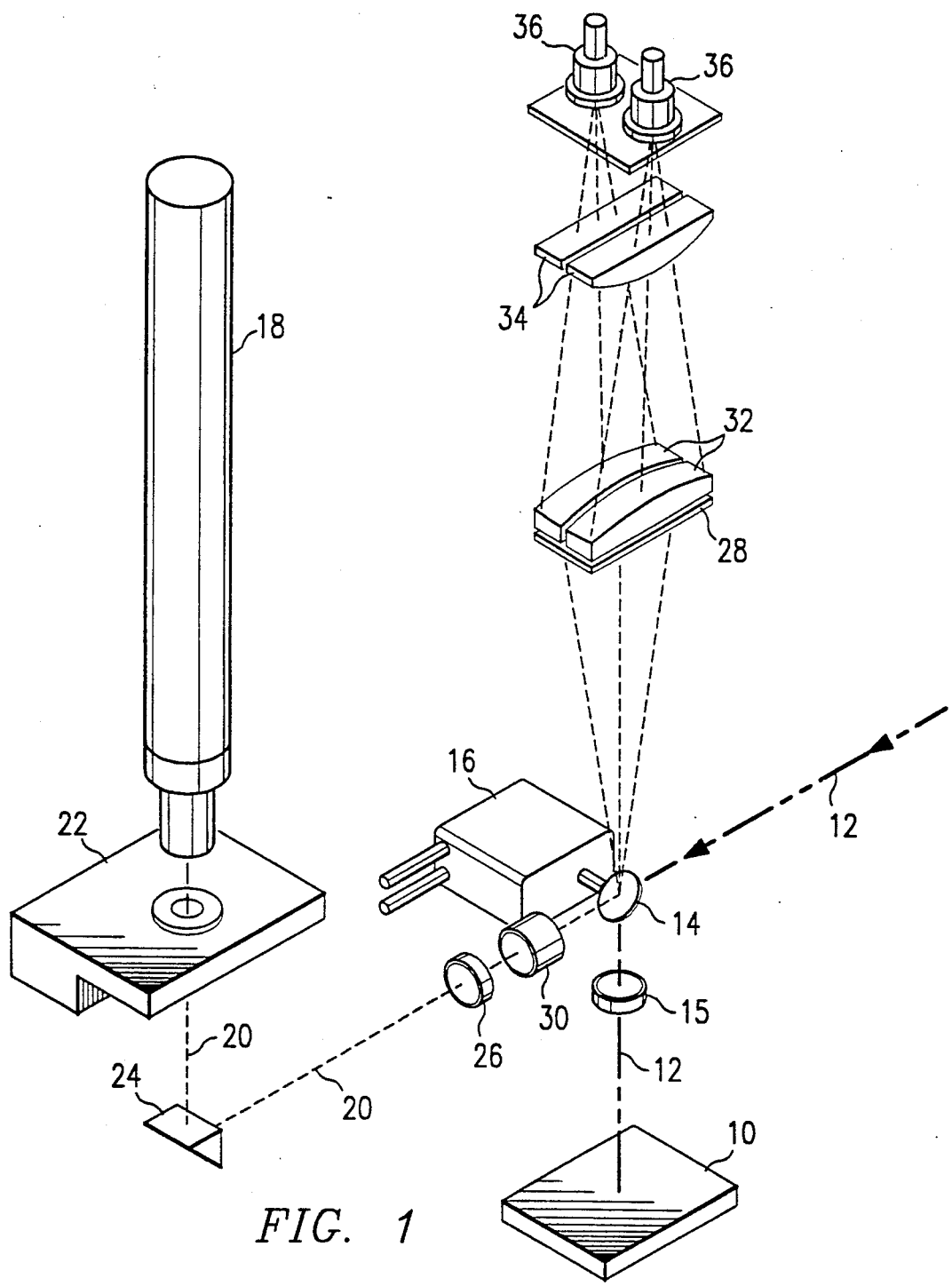
FIG. 1 illustrates apparatus for precision control of galvanometer patterning systems according to the present invention.

FIG. 1 illustrates apparatus according to the present invention for precision control of a galvanometer patterning system. In general, galvanometer patterning systems allow for patterning of workpieces, such as plastics. For example, a workpiece 10 as shown in FIG. 1 is patterned by a patterning beam 12. Patterning beam 12 may be, for example, laser or ultraviolet light. The pattern to be formed on workpiece 10 by patterning beam 12 is controlled by galvanometer mirror 14, since patterning beam 12 is optically deflected onto workpiece 10 from galvanometer mirror 14 through lens 15. Consequently, precise control of galvanometer mirror 14 is necessary for accurate patterning. The pattern to be created on workpiece 10 is produced by modulating the intensity of patterning beam 12 depending on the position at which it falls in workpiece 10.

A patterning processor, to be discussed later, controls the position of galvanometer mirror 14 by sending current to galvanometer 16. The patterning processor also controls the position of the workpiece and controls modulation of the patterning beam. The inertia of galvanometer mirror 14 and the shaft connecting it to galvanometer 16 and other factors prevent precise control of the position of galvanometer mirror 14 and the pattern laid down on workpiece 10. Therefore, real time precision measurement of the position of galvanometer mirror 14 is required for accurate patterning.

According to the present invention, a beam of light, such as laser light, is deflected off of the back side of galvanometer mirror 14 and measured to determine the exact location of mirror 14 in real time. As shown in FIG. 1, this light beam is generated by measurement beam source 18. The measurement beam is shown generally by reference number 20 in FIG. 1. Measurement beam 20 may be, for example, a laser light beam, and measurement beam source 18 may comprise a helium neon laser source. Shutter 22 is included as a safety element to allow obstruction of measurement beam 20 if required. Measurement beam 20 is directed towards galvanometer mirror 14 by reflection through prism 24. It should be understood that measurement beam 20 may be transmitted directly to galvanometer mirror 14, rather than reflecting it through prism 24, without departing from the intended scope of the present invention.

Measurement beam 20 is focused into a sharp line by cylinder lens 26. The focal length of cylinder lens 26 is such that the sharply focused line falls on a grating filter, side-by-side gratings 28. This focused line produced by cylinder lens 26 may be split into two lines by splitter 30. As will be discussed, each of these focused lines will fall on different sides of the side-by-side gratings 28.

As galvanometer mirror 14 moves back and forth, the focused line, or focused lines if splitter 30 is included, will move along the gratings of side-by-side gratings 28. The gratings are formed parallel to the focused line, such that the focused line will be filtered to either pass through or be blocked by the gratings of the side-by-side gratings 28, depending on the position of mirror 14. The measurement beam light passing through side-by-side gratings 28 is focused through an anamorphic condenser consisting of spherical lens segments 32 and cylindrical lens segments 34. This anamorphic condenser focuses all the light from the various angles of the galvanometer mirror 14 onto measurement detector 36. Measurement detector 36 may comprise photodiodes. As shown in FIG. 1, two spherical lens segments 32, two cylindrical lens segments 34, and two photodiodes are illustrated. One of each of these gathers and detects the measurement beam passing through one side of the side-by-side gratings 28, and the others gather and detect the measurement beam passing through the other side of the side-by-side gratings 28. It should be understood that cylindrical lens segments 34 may comprise a single cylindrical lens segment without departing from the intended scope of the present invention.

Figure 2A:
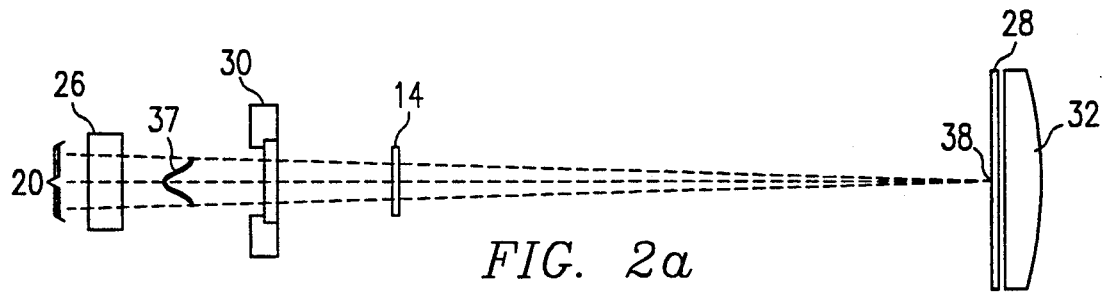
FIGS. 2a through 2d illustrate measurement optics of a system according to the present invention.

Referring now to FIGS. 2a–2d, schematic representations of the measurement beam 20 are illustrated. For clarity, the measurement beam is shown as passing through galvanometer mirror 14. It should be understood that measurement beam 20 is deflected off of the back side (measurement side) of galvanometer mirror 14. As shown in FIG. 2a, the measurement beam 20 is focused by cylinder lens 26 onto side-by-side gratings 28. With a laser source used to generate measurement beam 20, it will have a Gaussian cross-section as shown by curve 37. As discussed previously, measurement beam 20 is focused to a sharply focused line. In FIG. 2a, the sharply focused line is perpendicular to the plane of the paper, and therefore appears as a point 38. In one embodiment of the present invention, the focal length of cylinder lens 26 is 250 millimeters.

Figure 2B:
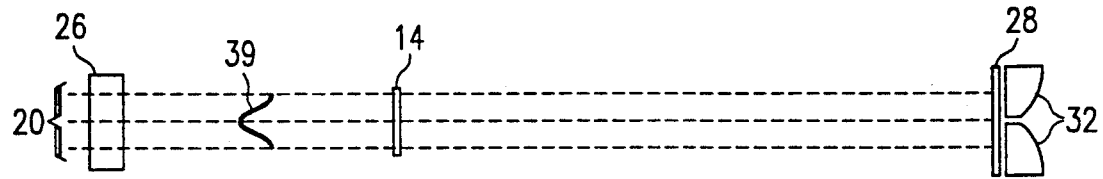

FIG. 2b is a side view of measurement beam 20. As shown in FIG. 2b, splitter 30 is omitted. In this embodiment, the measurement beam 20 is focused by cylinder lens 26 into a focused line on side-by-side gratings 28. The orientation of this line is apparent by comparing FIGS. 2a and 2b. If measurement beam 20 is laser light, it will have a Gaussian cross-section as shown by curves 39.

Figure 2C:
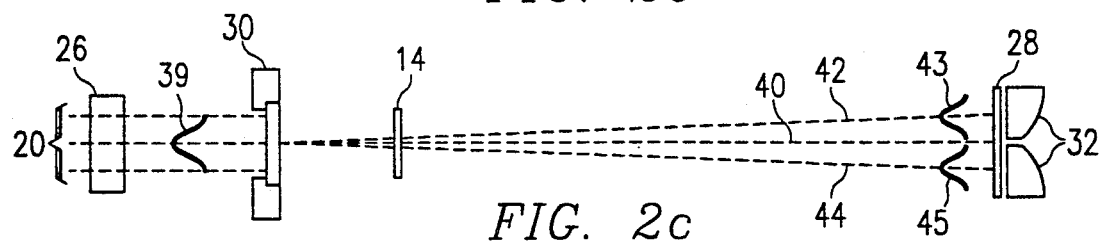

FIG. 2c illustrates a side view of measurement beam 20 including a splitter 30. In this particular illustration, splitter 30 comprises a binary diffractive phase-grating. It should be understood that other splitters may be used without departing from the intended scope of the present invention. The construction of this binary diffractive phase-grating will be discussed in connection with FIG. 3. In operation, the binary diffractive phase-grating used for splitter 30 creates two focused lines falling on either side of center line 40. Thus, one of the focused lines will fall on one side of the side-by-side gratings 28, and the other focused line will fall on the other side. The light intensity at center line 40 is ideally zero, and in actual practice is on the order of less than 1%. Lines 42 and 44 represent the centers of the focused lines falling on either side of center line 40. In a particular embodiment, the intensity at the center of these lines is greater than 35% of the total intensity. Note that in FIG. 2c, the beams 20, 42 and 44 all have Gaussian cross-sections, if a laser source is used. Also in 2c, beams 42 and 44 represent the central rays, and the Gaussian distributions are shown by curves 43 and 45.

Figure 2D:
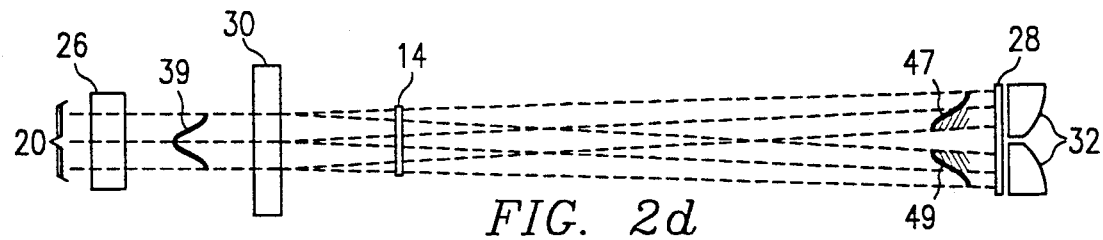

FIG. 2d illustrates an implementation in which splitter 30 comprises a hi-prism. This hi-prism implementation of splitter 30 generates two distinct refractively derived beams as shown in FIG. 2d, of which each is a divided Gaussian beam, as shown by curves 47 and 49. Each of these beams falls on different sides of side-by-side gratings 28.

Figure 3:
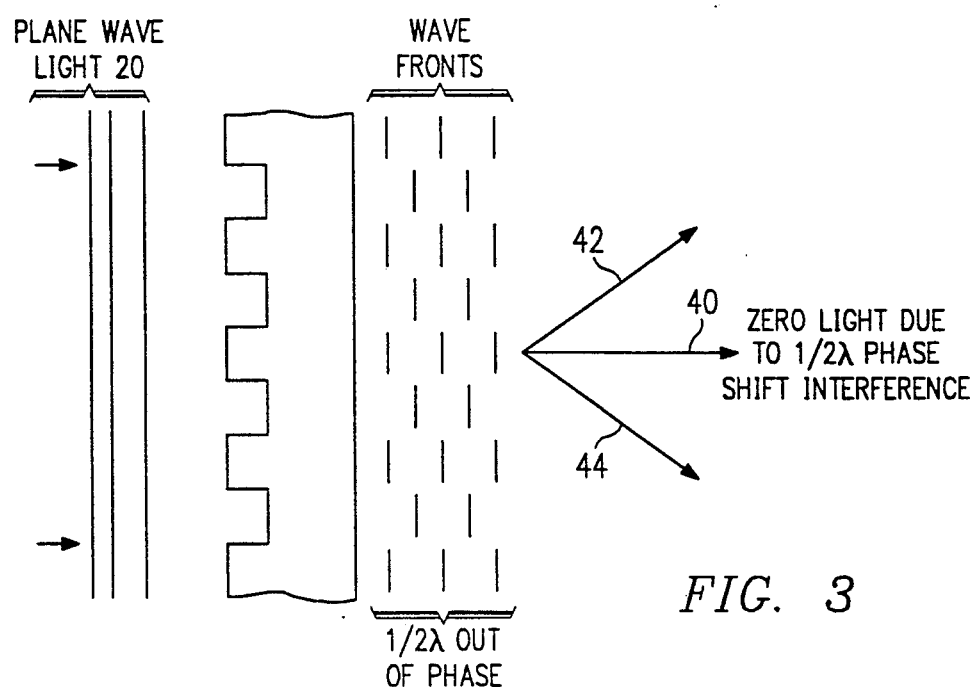
FIG. 3 illustrates a binary diffractive phase grating according to the present invention.

FIG. 3 illustrates one embodiment of a binary diffractive phase-grating for use as splitter 30. As shown in FIG. 3, the measurement beam 20, composed of plane wave light, falls on binary diffractive phase grating splitter 30. The thickness of splitter 30, as shown in FIG. 3, varies in a repeating fashion such that the measurement beam passing through the alternately thick and thin portions of splitter 30 is one-half wavelength out of phase. This one-half wavelength phase shift results in destructive interference such that zero light intensity results along center line 40. Constructive interference occurs along lines 42 and 44, resulting in maximum light intensity along these lines. Use of such a splitter compensates for errors which may arise when using only a single focused line caused by wobble in the mirror. In a particular embodiment, lines 42 and 44 are 1,528° apart.

FIGS. 4a–4e illustrate various views of side-by-side gratings 28 and cylinder lens segments 32. FIG. 4a illustrates a front view of side-by-side gratings 28. The actual gratings on side-by-side gratings 28 are two sets of gratings 46 and 48. As shown, the focused line of light, or the focused lines of light, when a splitter 30 is used, fall on gratings 46 and 48. Various grating patterns may be used without departing from the intended scope of the present invention. Two particular grating patterns which may be used are shown in FIGS. 4d and 4e. FIGS. 4d and 4e illustrate blow-ups of particular areas of gratings 46 and 48, it being understood that the grating pattern continues throughout the length of gratings 46 and 48 shown in FIG. 4a.

As shown in FIG. 4d, a repeating pattern of alternately transparent and opaque gratings are used. As shown in FIG. 4d, the pitch of these gratings may be equal. Furthermore, FIG. 4d illustrates that the gratings of each of the gratings 46 and 48 are offset, the purpose of which will be discussed below. In a particular embodiment, each set of gratings are offset ¼ of the pitch.

FIG. 4e illustrates another possible grating pattern, in which the pitch of each of the side-by-side gratings is different. In particular, as shown in FIG. 4e, the pitch of grating 46 is fine, while that of grating 48 is coarse. Other grating patterns may be used without departing from the intended scope herein. For example, the pitch of each set of gratings may vary to compensate for any nonlinearity of lens 15.

In a particular embodiment, the grating pattern shown in FIG. 4d is used with a pitch of 80 microns. Furthermore, 544 pitch cycles are used in each grating, for a total grating length of approximately 43.5 millimeters. The spacing between the gratings is on the order of 0.5 to 1 millimeter. The height of the gratings, as shown in FIG. 4d, is approximately 5 millimeters.

FIG. 4b illustrates a top view of side-by-side gratings 28 and spherical lens segments 32. As illustrated, spherical lens segments 32 are located behind side-by-side gratings 28. FIG. 4c illustrates a side view of side-by-side gratings 28 and spherical lens segments 32. As shown in FIG. 4c, two separate spherical lens segments 32 are included in the illustrated embodiment.

Figure 5:
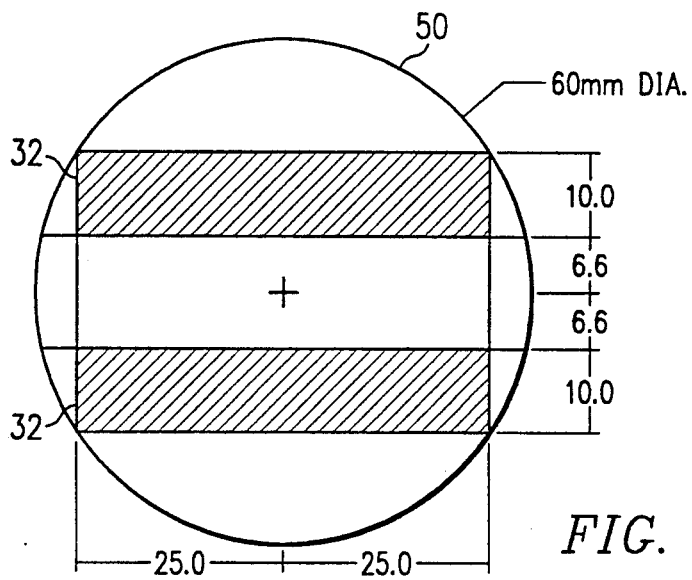
FIG. 5 illustrates a spherical lens from which the spherical lens segments according to the present invention may be obtained.

FIG. 5 illustrates a particular embodiment of the spherical lens segments 32. As shown in FIG. 5, the spherical lens segments 32 are cut out of a spherical lens 50. Dimensions for a particular embodiment are illustrated in the FIGURE.

Figure 6:
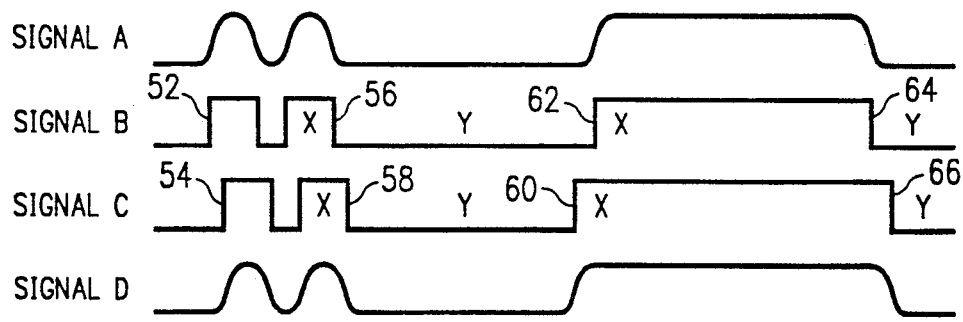
FIG. 6 illustrates wave forms arising in a system constructed according to the teachings of the present invention.

FIG. 6 illustrates measurement signals generated by the apparatus previously disclosed. Signals A and D represent light intensity impinging upon the detector 36 shown in FIG. 1. Signals B and C of FIG. 6 illustrate the signals from detection circuitry to be described in connection with FIG. 7. Signal A represents the light intensity impinging on one of the photodiodes of measurement detector 36 and signal B represents a digital representation of that signal. Likewise, signal D represents light intensity impinging on the other diode of measurement detector 36 and signal C represents a digital representation of that signal.

When the galvanometer mirror 14 is in a particular location, the focused line or lines impinging on the side-by-side gratings 28 will either be passed through or blocked by the gratings. Because the gratings are offset, the light will be blocked by or passed through each set of gratings at slightly different positions of the galvanometer mirror 14. Thus, as shown by signals B and C of FIG. 6, edge 52 rises slightly before edge 54, indicating that light has passed through one set of the side-by-side gratings 28 just before light passes through the other set of gratings of the side-by-side gratings. Likewise, edge 56 falls slightly before edge 58, indicating the galvanometer has moved.

Each grating represents a digital address of the galvanometer mirror 14. Thus, if the galvanometer mirror moves in one direction at a constant rate, square waves will result from each set of gratings of the side-by-side gratings 28. Thus, for example, a high value of the square wave indicates the galvanometer is in a particular position, the succeeding low value of the square wave indicates that the galvanometer mirror has progressed to the next location, the next high value of the square wave indicates that the galvanometer mirror 14 has advanced to the next location, and so on. If the galvanometer mirror is stopped, the output will remain either high or low, depending on the position of the galvanometer mirror 14, until the galvanometer mirror 14 moves again. It is apparent that the more quickly that the galvanometer mirror moves, the shorter the highs and lows of the square wave will be, and the slower the galvanometer mirror 14 moves, the longer the highs and lows of the square wave will be.

The offset of each set of the gratings of the side-by-side gratings 28 allows for detection of reversal of direction of the galvanometer mirror 14. As shown in FIG. 6, the galvanometer mirror 14 has changed direction between edges 56 and 58 and edges 60 and 62 of signals B and C. As shown in FIG. 6, edge 56 falls, indicating that the galvanometer mirror 14 has moved from one location, X to a new location Y. Likewise, falling edge 58 indicates this same movement. Continuing along in time, signal C rises at edge 60 before signal B at edge 62. Because of the offset, it is apparent that the galvanometer mirror 14 has reversed direction since edge 60 rises before edge 62. If the galvanometer mirror 14 had not changed direction, but rather continued in its same direction, edge 62 would have risen before edge 60. Continuing along now further in time, edge 64 falls before edge 66, indicating that the galvanometer mirror 14 has again switched positions and moved back to position Y.

Figure 7:
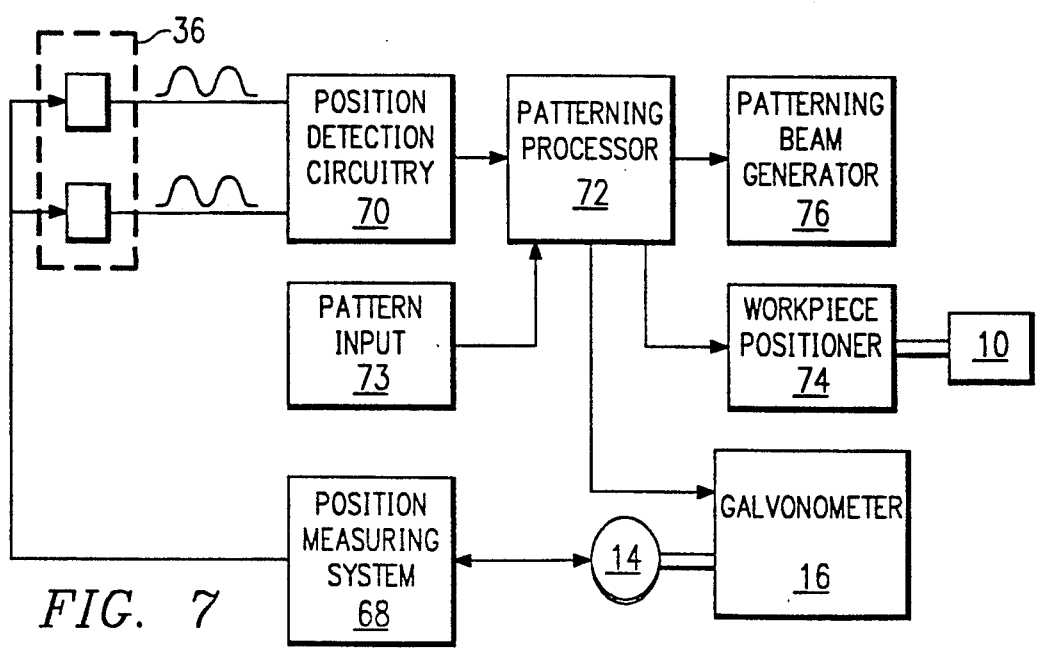
FIG. 7 illustrates a block diagram of a galvanometer patterning system according to the present invention.

FIG. 7 is a block diagram of a patterning system including the galvanometer measuring apparatus and method disclosed above. As shown in FIG. 7, position measuring system 68, as disclosed above, measures the position of the galvanometer mirror 14 and outputs measurement signals from measurement detector 36. Position detection circuitry 70 receives the signals output by measurement detector 36 and generates galvanometer position information. Position detection circuitry 70 may generate square waves as discussed in connection with FIG. 6. It should be understood, however, that position detection circuitry can generate position detection information directly from the output from measurement detector 36 without generating square waves and without departing from the intended scope of the present invention.

Position detection circuitry 70 transmits galvanometer position information to patterning processor 72. Patterning processor 72 receives a pattern to be performed from pattern input 73. To lay down this pattern, patterning processor 72 controls the movement of the galvanometer 16 and thus galvanometer mirror 14. Furthermore, patterning processor 72 controls the position of the workpiece 10 through workpiece positioner 74. Based on the position of the workpiece and the position of the galvanometer, patterning processor 72 also controls a patterning beam generators 76. Patterning processor 72 controls patterning beam generator 76 such that the intensity of the patterning beam is appropriately modulated to precisely form the correct pattern on the workpiece 10. Because patterning processor 72 has precise information on the position of galvanometer mirror 14, it can control the intensity of the patterning beam, which is optically deflected off of the galvanometer mirror 14, such that the patterning beam falls on the workpiece in only the appropriate locations.

Although the present invention has been described in detail, it should be understood that various changes, substitutions and alterations can be made without departing from the intended scope of the invention as defined solely by the appended claims.

What is claimed is:

1. A galvanometer position measurement system, comprising:

a galvanometer, including a galvanometer mirror;

a light source operable to generate a measurement beam to be deflected off of said galvanometer mirror;

a cylinder lens operable to focus said measurement beam into a focused line;

a grating filter having two sets of gratings, each set of gratings being offset, said gratings being substantially parallel to said focused line, such that movement of said galvanometer mirror causes said focused line to move along said gratings, and wherein said gratings are operable to block or pass said focused line based on the position of said galvanometer mirror;

a splitter operable to generate, in cooperation with said cylinder lens, two focused lines, such that said focused line is divided into two focused lines, each of said focused lines falling on a different set of gratings;

a detector operable to detect light from said focused line transmitted through each set of gratings; and an anamorphic condenser operable to focus the light transmitted through said gratings onto said detector.

2. The system of claim 1, wherein said splitter comprises a binary diffractive phase-grating.

3. The system of claim 1, wherein said splitter comprises a bi-prism.

4. The system of claim 1, wherein said detector comprises two photodiodes, and wherein said anamorphic condenser focuses light transmitted through one set of gratings onto one of said photodiodes and light transmitted through the other set of gratings onto the other photodiode.

5. The system of claim 1, wherein each set of ratings comprises a series of alternately transparent and opaque lines.

6. The system of claim 5, wherein said alternately transparent and opaque lines are characterized by a pitch, said pitch of each set of gratings being substantially equal.

7. The system of claim 5, wherein said alternately transparent and opaque lines are characterized by a pitch, said pitch of each set of gratings being unequal.

8. A patterning system for patterning a workpiece, comprising:

a patterning beam source operable to generate a patterning beam;

a galvanometer, including a galvanometer mirror, said galvanometer mirror having a measurement side and a patterning side off of which said patterning beam is deflected for patterning the workpiece;

a light source operable to generate a measurement beam to be deflected off of said measurement side of said galvanometer mirror;

a cylinder lens operable to focus said measurement beam into a focused line;

a grating filter having two sets of gratings, each set of gratings being offset, said gratings being substantially parallel to said focused line, such that movement of said galvanometer mirror causes said focused line to move along said gratings, and wherein said gratings are operable to block or pass said focused line based on the position of said galvanometer mirror;

a splitter operable to generate, in cooperation with said cylinder lens, two focused lines, such that said focused line is divided into two focused lines, each of said focused lines falling on a different set of gratings, said splitter comprising a binary diffractive phase-grating;

a detector operable to detect light from said focused line transmitted through each set of gratings;

position detection circuitry coupled to said detector for determining the position of the workpiece based on the light detected by said detector; and a patterning processor coupled to said position detection circuitry, said patterning beam source, and said galvanometer, said patterning processor operable to position said galvanometer mirror and control said patterning beam source based on the position of said galvanometer mirror, such that the appropriate pattern is produced on the workpiece.

9. The system of claim 8, and further comprising an anamorphic condenser operable to focus the light transmitted through said gratings onto said detector.

10. The system of claim 8, wherein each set of gratings comprises a series of alternately transparent and opaque lines.

11. The system of claim 10, wherein said alternately transparent and opaque lines are characterized by a pitch, said pitch of each set of gratings being substantially equal.

12. The system of claim 10, wherein said alternately transparent and opaque lines are characterized by a pitch, said pitch of each set of gratings being unequal.

13. A method of detecting the position of a galvanometer, comprising the steps of:

generating a measurement beam to be deflected off of a galvanometer mirror;

focusing the measurement beam into a focused line;

splitting the focused line into two focused lines, each of the focused lines falling on a different set of gratings;

filtering the focused line through two sets of gratings, each set of gratings being offset, such that movement of the galvanometer mirror causes the focused line to move along the ratings, and wherein the gratings are operable to block or pass the focused line based on the position of the galvanometer mirror;

anamorphically condensing the light transmitted through the gratings onto the detector; and detecting light from the focused line transmitted through each set of gratings.

14. A galvanometer position measurement system, comprising:

a galvanometer, including a galvanometer mirror;

a light source operable to generate a measurement beam to be deflected off of said galvanometer mirror;

a cylinder lens operable to focus said measurement beam into a focused line;

a grating filter having two sets of gratings, each set of gratings being offset, said gratings being substantially parallel to said focused line, such that movement of said galvanometer mirror causes said focused line to move along said gratings, and wherein said gratings are operable to block or pass said focused line based on the position of said galvanometer mirror;

a splitter operable to generate, in cooperation with said cylinder lens, two focused lines, such that said focused line is divided into two focused lines, each of said focused lines falling on a different set of gratings, said splitter comprising a binary diffractive phase-grating; and a detector operable to detect light from said focused line transmitted through each set of gratings.

15. A galvanometer position measurement system, comprising:

a galvanometer, including a galvanometer mirror;

a light source operable to generate a measurement beam to be deflected off of said galvanometer mirror;

a cylinder lens operable to focus said measurement beam into a focused line;

a grating filter having two sets of gratings, each set of gratings being offset, said gratings being substantially parallel to said focused line, such that movement of said galvanometer mirror causes said focused line to move along said gratings, and wherein said gratings are operable to block or pass said focused line based on the position of said galvanometer mirror;

a splitter operable to generate, in cooperation with said cylinder lens, two focused lines, such that said focused line is divided into two focused lines, each of said focused lines falling on a different set of gratings, said splitter comprising a bi-prism; and a detector operable to detect light from said focused line transmitted through each set of gratings.

* * * * *